United States Patent [19]
Garavaglia

[11] 3,986,905
[45] Oct. 19, 1976

[54] PROCESS FOR PRODUCING SEMICONDUCTOR DEVICES WITH UNIFORM JUNCTIONS

[75] Inventor: Paul M. Garavaglia, St. Louis, Mo.

[73] Assignee: Monsanto Company, St. Louis, Mo.

[22] Filed: Dec. 16, 1974

[21] Appl. No.: 532,982

Related U.S. Application Data

[63] Continuation-in-part of Ser. No. 428,174, Dec. 26, 1973, abandoned.

[52] U.S. Cl.................. 148/188; 148/186; 148/187; 148/1.5; 252/62.3 GA; 252/62.3 E
[51] Int. Cl.² ..................................... H01L 21/225
[58] Field of Search .......... 148/188, 186, 187, 189, 148/190, 1.5; 252/62.3 GA, 62.3 E; 117/201

[56] References Cited
UNITED STATES PATENTS

| 3,354,005 | 11/1967 | Lepiane et al. | 148/188 |
| 3,532,563 | 10/1970 | Genser | 148/188 |
| 3,615,943 | 10/1971 | Genser | 148/188 |
| 3,630,793 | 12/1971 | Christensen | 148/188 |
| 3,660,156 | 5/1972 | Schmidt | 117/201 |
| 3,789,023 | 1/1974 | Ritchie | 252/518 |
| 3,801,384 | 4/1974 | Schmidt | 148/188 |
| 3,837,873 | 9/1974 | Pollack et al. | 106/287 SE |

Primary Examiner—G. Ozaki
Attorney, Agent, or Firm—Peter S. Gilster

[57] ABSTRACT

In a high temperature solid-solid diffusion process for diffusing impurities into a semiconductor body from a dopant source material, semiconductor surface attack is prevented by the presence of a layer comprising particles of a material substantially inert to the diffusion between the semiconductor body and dopant source material. Uniform deep regions and/or regions of high conductivity can be obtained, if desired.

17 Claims, 8 Drawing Figures

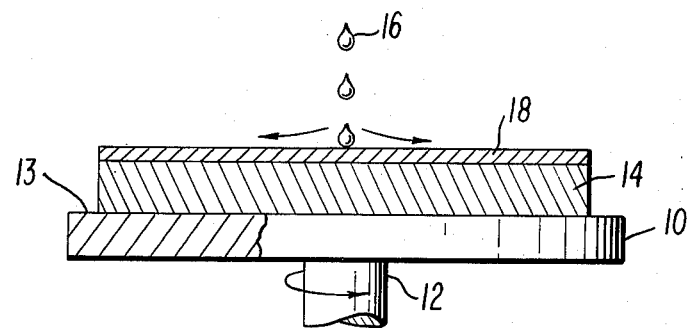
FIG.1a
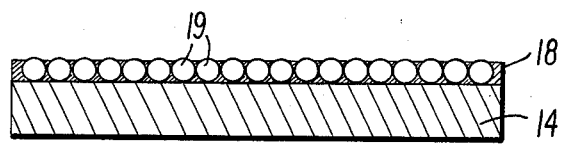
FIG.1b
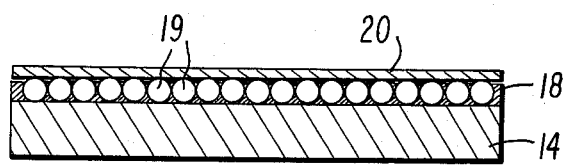
FIG.1c
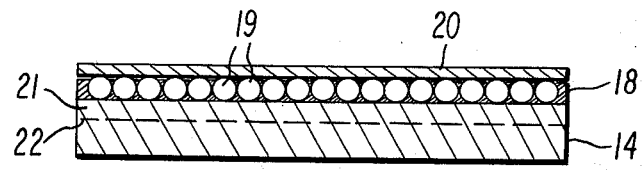
FIG.1d
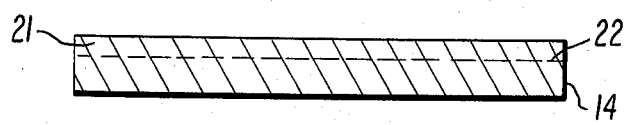
FIG.1e
FIG.1

PROCESS FOR PRODUCING SEMICONDUCTOR DEVICES WITH UNIFORM JUNCTIONS

CROSS-REFERENCE TO RELATED APPLICATION

This application is a continuation-in-part of application Ser. No. 428,174, filed Dec. 26, 1973, and now abandoned.

BACKGROUND OF THE INVENTION

1. Field of the Invention

The present invention relates to the diffusion of impurities into semiconductor bodies, more particularly, to an improved solid-solid diffusion process.

2. Description of the Prior Art

Vapor diffusion processes for selectively introducing impurities into semiconductor substrates are well known. In these processes an impurity-containing compound is brought into contact in the vapor phase with a semiconductor body in a low temperature "pre-deposition" diffusion followed by a subsequent "drive-in" diffusion, the surface impurities being driven into the semiconductor body to the desired depth dependent upon the diffusion time and temperature.

A substantial disadvantage encountered with the above type or processing is that different process conditions are required for the "predeposition" and the "drive-in" diffusion.

Recently, diffusion processes have been developed which require only a "drive-in" diffusion based upon a solid diffusion source which is deposited directly on the exposed surface area of a semiconductor body into which the diffusion is to be performed.

The semiconductor body, optional diffusion mask if desired, and diffusion source are heated to an elevated temperature to drive impurities from the solid diffusion source into the semiconductor body.

Such solid sources include "spin-on" or "paint-on" glasses, which can be spun onto a semiconductor body by centrifugal force as a thin coating. Spin-on doping compositions are disclosed, for example, in U.S. Pat. Nos. 3,532,563 and 3,615,943 to Genser.

Such "spin-on" or "paint-on" glasses have generally proven satisfactory for the formation of shallow PN junctions or diffused regions of relatively low impurity concentration, but have not proven satisfactory for forming a deep-diffused PN junctions or heavily doped diffused regions. For instance, such glasses generally cannot be used to form a deep diffused junction on the order of 3 to 4 mils. Further, such glass sources become relatively rapidly depleted of impurities when subjected to relatively long temperature cycles as are required for deep or high concentration diffusions with such compositions.

A recent development in the art has been the use of doping or dopant papers to perform solid-solid diffusions into a semiconductor body. Dopant papers have generally been used in a manner similar to "spin-on" or "paint-on" glasses by contacting them with the semiconductor body into which the diffusion is to occur and elevating the temperature of the total assembly, whereby impurities diffuse from the dopant paper into the semiconductor substrate.

Such dopant papers are commercially available from Filmtronics Inc., Butler, Pennsylvania, and generally comprise an organic binder which contains an organic solvent which includes a desired P- or N-type impurity. Such materials are most commonly available under the general specification of "boron dopant paper" or "phosphorus dopant paper", and generally contain high amounts of dopant, e.g., on the order of 40 weight percent boron and 60 weight percent phosphorus for "boron" and "phosphorus" dopant paper, respectively. This general type of doping paper is also disclosed in U.S. Pat. No. 3,630,793 (Christensen et al.).

The use of such dopant papers has, however, been subject to various faults. For example, with phosphorus dopant papers irregular surface attack on the semiconductor body where the dopant paper touches the semiconductor occurs during diffusion, resulting in a non-uniform or wavy junction, highly objectionable from the device manufacturer's point of view.

Even if such dopant papers are separated from the semiconductor body by a film of silicon dioxide a non-uniform or wavy junction still results, as illustrated in FIG. 4 later discussed.

SUMMARY OF THE INVENTION

It is thus one object of the present invention to provide a process for controlling the uniformity of a diffused junction.

Yet a further object of the present invention is to provide a process for forming uniform deep diffused junctions in a semiconductor body.

Still yet another object of the present invention is to provide a method for forming regions of high conductivity in a semiconductor body.

Yet a further object of the present invention is to provide a solid-solid diffusion process using a dopant source material, e.g., a dopant paper, where the semiconductor body into which the diffusion is proceeding is not pitted or stained during the diffusion.

Still a further object of the present inventon is to provide a process for forming uniform deep diffused junctions and/or regions of high conductivity at reduced times as compared to prior art processes.

These and other objects of the present invention are achieved by the presence of a layer comprising particles inert to the diffusion conditions, e.g., silicon or silicon dioxide particles, between the semiconductor body undergoing diffusion and the dopant source material which is the source of the diffusing impurities, the layer comprising the particles serving to space the dopant source material from the surface of the semiconductor body during the diffusion.

BRIEF DESCRIPTION OF THE DRAWINGS

FIGS. 1a–1e illustrate a sequence of the process steps of a solid-solid diffusion process in accordance with the present invention.

DETAILED DESCRIPTION OF THE INVENTION

Figure 2:
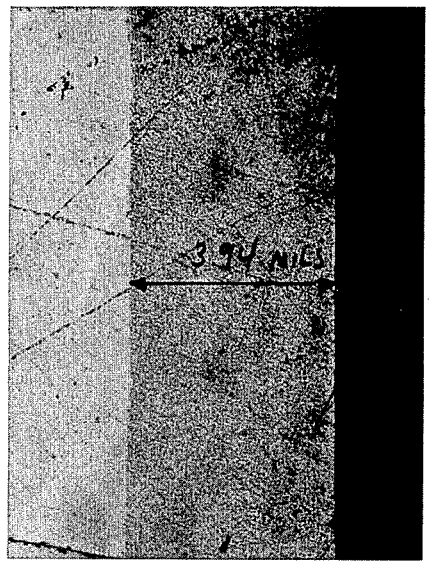
FIGS. 2 and 3 are photomicrographs of stained cross-sections of substrates diffused with dopants in accordance with the present invention.

The general purpose of the present invention is to provide a new and improved solid-solid diffusion process having all of the advantages of similarly employed prior art diffusion processes while possessing none of the heretofore described disadvantages.

To achieve this result, the present process includes the steps of forming a layer comprising particles of a material inert to the diffusion conditions on the surface of a semiconductor body which is to be diffused, placing a dopant source material, such as a sheet of commercially available dopant paper, on top of the layer comprising the particles and then subjecting the composite thus formed to a selected elevated temperature to drive impurities from the dopant source material into the semiconductor body while the interposed layer comprising the particles spaces the dopant source material therefrom.

The dopant papers as are disclosed in U.S. Pat. No. 3,630,793 are typical of those as are used in the present invention as the dopant source material. The extremely high dopant concentrations which such materials provide permit them to function as an infinite dopant source in the context of a process run.

While the diffusion process of the present invention can be used to form shallow and/or low concentration regions, is particularly useful in forming a region of very high impurity concentration (e.g., on the order of $5 \times 10^{20}$ to $1 \times 10^{21}$ atoms/cc) and/or to produce a deep diffused region in a semiconductor body, e.g., on the order of 4 mils or deeper, and finds particular application in the fabrication of deep diffused PN junction semiconductor devices with high conductivity regions, such as power rectifiers.

The present invention finds application with semiconductor substrates as have been subjected to high temperature solid-solid diffusions in the prior art. Since the majority of the following discussion will be in terms of device fabrication, hereafter the terms "semiconductor body" and "semiconductor substrate" will be used interchangeably. For example, silicon and germanium are illustrative of the semiconductors most commonly subjected to solid-solid diffusions. For purposes of brevity, hereafter the present invention will be discussed primarily in terms of a silicon semiconductor substrate, which will be referred to as a silicon substrate. It shall be understood, however, that the discussion in terms of silicon applies to other semiconductor substrates which can be processed in accordance with the present invention, as the essential concepts of the present invention are of general application.

The silicon substrate of the present invention can be an N-type or P-type substrate, if desired. Since the processing concepts are substantially identical for N- or P-type substrates, for purposes of brevity the following discussion will generally be in terms of an N-type silicon substrate.

The impurities which can be diffused following the process of the present invention are not particularly limited and in general can be selected from those P- and N-type impurities amenable to solid-solid diffusions by prior art processes, for example, phosphorus, boron, arsenic, zinc, antimony and like impurities can be diffused in accordance with the present invention. In a specific exemplification, a P-type impurity such as boron can be diffused into a P-type silicon substrate to form a P+ region and/or an N-type impurity such as phosphorus can be diffused into an N-type silicon substrate to form an N+ region. For purposes of illustration, hereafter the present invention will be discussed primarily with reference to the diffusion of phosphorus into an N-type silicon substrate.

Turning now to the primary feature of the present invention, as earlier indicated, the impurities present in a solid dopant source material, such as a dopant paper as heretofore described, are diffused into a silicon substrate while the dopant source material is spaced from the silicon substrate by a layer comprising particles which are substantially inert to the diffusion conditions.

Particles which are substantially inert to the diffusion conditions illustrate the following characteristics:

They do not introduce contaminants into the silicon substrate during the diffusion. Accordingly, they are of high purity and generally have a chemical identity similar to that of the substrate. For instance, while a material such as high purity silicon nitride or a like material could be used in particulate form for the diffusion of a silicon substrate, more generally the particles will be silicon or silicon dioxide.

The particles should not vaporize, decompose, fuse or adhere to any extent to the silicon substrate during the diffusion; obviously, this criterion implies the particles must retain their particulate nature throughout the diffusion.

The particles are of course, undoped prior to the diffusion. An attempt was made to use doped particles in combination with a dopant paper, but surface damage to the silicon substrate resulted.

Two preferred embodiments are contemplated: In a first preferred embodiment, silicon particles are adhered to a silicon substrate; and in a second preferred embodiment silicon dioxide particles are intimately blended with an adhering material, applied to the silicon substrate and the resulting layer dried to provide a cushiony, soft, porous layer.

Turning initially to the embodiment wherein silicon particles are used, the primary function of the silicon particles is to prevent the solid dopant source material, which for further exemplification will be a dopant paper as heretofore discused, discussed, contacting the silicon substrate. The silicon particles should be uniform in shape and size and preferred results are obtained when the silicon particles are substantially spherical and have a minimum average particle diameter of about 10 mils. The maximum size of the silicon particles is not as important as the minimum particle size, but little is to be gained by using silicon particles having an average particle diameter much greater than about 20 mils. Most preferably, the silicon is substantially spherical and has an average particle diameter of 10 to 15 mils.

Substantially spherical silicon particles as described above can be obtained by the processes taught in U.S. Pat. Nos. 2,712,621 (North); 2,935,386 (Selker), or 3,543,831 (Schile).

Since the primary function of the silicon particles is to prevent the dopant paper from contacting the silicon substrate during the high temperature diffusion, the exact silicon particle application density is not overly critical so long as this function is exhibited. Most preferably, the spherical silicon particles are applied in a density such that the silicon particles are touching or within a one particle diameter of neighboring particles. Usually, the silicon spheres are applied as a layer one sphere deep, but this is not mandatory and deeper layers can be used so long as the dopant paper is maintained a uniform distance from the silicon substrate.

While the silicon spheres are preferably single crystal silicon, if polycrystalline silicon of sufficient purity can be obtained such may be used in the present invention.

Since the substrate must be handled for the diffusion, the silicon particles must be adhered to the silicon substrate. In theory, any adhering material can be used which does not inhibit diffusion, degrade during the diffusion, introduce impurities into the substrate and which can be easily removed after the diffusion, but as a practical matter a thin adhering film derived from an organosilicon compound has been found to be most useful.

The adhering film must be thick enough to hold the silicon particles to the silicon substrate but not so thick as to inhibit the passage of the diffusing impurities or to prevent the silicon particles from projecting from the surface thereof to contact and space the dopant paper from the silicon substrate. The exact thickness of the dried adhering film is not overly important, so long as the above criteria are met, and typically an adhering film on the order of 1,500 to 2,000 angstroms is used.

Representative of the organosilicon compounds used to form the adhering film are the organosilanes, with the tetra lower alkoxysilanes, e.g., tetraethoxysilane, being most preferred.

The organosilicon is generally applied as a solution in a volatile solvent, for example, a lower aliphatic alcohol or mixture of such alcohols. Preferred of such alcohols are methanol, ethanol and isopropanol. Although ethanol is most commonly used, since it is highly volatile it will usually be blended with isopropanol, which is of lower volatility, to permit easier solution handling.

The organosilicon materials as are disclosed in U.S. Pat. No. 3,615,943, Genser, can also be used in the present invention, so long as they are, of course, undoped.

Materials as described in that patent, which is hereby incorporated by reference, are silicon acetate compounds which can be represented by the general formula:

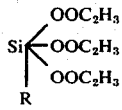

in which R is an acetate or a vinyl group.

A specific example of such formulation is:
13.4 cc tetraethoxysilane
36.0 cc ethanol
2.60 cc methanol
0.6 cc isopropanol Most preferably, 7.6 cc of glacial acetic acid is added to the above formulation to improve the properties of the formulation.

The solution of the organosilicon compound can be applied to the silicon substrate, for example, by spinning, by an eye dropper or the like, and then the silicon particles applied thereto, most preferably as a one-sphere deep layer with the spheres in contact across the silicon substrate. The volatiles are then removed by drying, typically by air drying at room temperature though higher temperatures can be used if desired, whereupon a thin, adhering layer of a glass-like nature is formed which will hold the silicon spheres to the silicon substrate during handling and during the diffusion itself. It is to be noted that there is no fusion of the silicon particles to the silicon substrate during the diffusion of the present invention.

The amount of organosilicon compound present in the solution of organosilicon compound is not overly important so long as, of course, sufficient organosilicon compound is present to adhere the silicon spheres to the silicon substrate and, of course, so long as the resulting adhering layer is not thick enough to inhibit the diffusion or prevent the spheres from protruding above the top of the adhering layer.

Diffusion is thereafter conducted at elevated temperatures as described at a later point of this specification.

In a second preferred embodiment of the present invention, a silicon dioxide particle containing layer is formed which is cushiony, soft and porous. The silicon dioxide particles are substantially smaller than the silicon spheres and are powdery in nature, typically having an average size of from about 140 to about 160 mesh, with silicon dioxide particles having an average size of about 145 mesh providing excellent results.

In distinction to the requirement that the silicon spheres be highly uniform, the silicon dioxide powder need not be spherical in nature, though generally speaking as commercially available the silicon dioxide powder will be in the form of irregular spheres. It is to be understood that the size of about 140 to about 160 mesh is not limitative in the present invention and silicon dioxide particles of smaller and larger mesh size, or of a varying size distribution, can be used with success so long as the characteristics of the cushiony, soft, porous layer later set out are provided. If excessively small silicon dioxide powder is used, however, the silicon dioxide powder containing layer will have a tendency to solidify and lose its porous nature. On the other hand, if excessively large silicon dioxide powder is used the silicon dioxide powder containing layer might become too porous, which should also be avoided.

Generally, silicon dioxide powder having the desired particle size is intimately mixed with a diluted solution of an organosilicon compound as heretofore described, applied to the silicon substrate, e.g., dispensed with a syringe, and thereafter dried at room temperature to remove the volatile solvents and provide a cushiony, soft, porous layer.

In the silicon sphere embodiment of the present invention the ratio of silicon spheres to organosilicon compound is not overly important. In the silicon dioxide powder embodiment, however, this ratio is relatively more important, and it must be established with some care. However, the following description will enable one skilled in the art to establish an appropriate silicon dioxide powder: organosilicon compound ratio. If too much organosilicon compound is present, during diffusion the silicon dioxide powder containing layer will excessively adhere to the silicon substrate and warp or shatter the substrate. Essentially, if too much organosilicon compound is present there will be too much "glass" present which causes excessive adhering to the silicon substrate. On the other hand, if too little organosilicon compound is present, the silicon dioxide powder containing layer will be too flaky, and the layer will simply fall from the silicon substrate during handling.

It is important that one avoid excess organosilicon compound because during the diffusion the silicon dioxide powder containing layer of the present invention actually lifts from the silicon substrate. This inherent "lifting" feature, if inhibited, can warp and even shatter the silicon substrate as heretofore described. Needless to say, upon a correct ratio of silicon dioxide powder to organosilicon compound the silicon dioxide powder containing layer is easily removed from the silicon substrate after diffusion, in fact, only a thin, white, powdery layer remains adhered to the silicon substrate, the bulk of the layer having "lifted" away from the silicon substrate in a uniform manner.

While the porosity of the silicon dioxide powder containing layer is not visible to the naked eye, under microscopic examination one can observe voids between the silicon dioxide particles. This porosity is important because the silicon dioxide particle containing layer is applied at substantial thicknesses, and if the layer is not porous the diffusing impurity might be blocked from the silicon substrate.

The silicon dioxide powder containing layer of the present invention is, after drying, most preferably at a thickness of from about 25 to about 30 mils. If this layer is substantially smaller than 25 mils, surface damage to the silicon substrate may result. On the other hand, if this layer is substantially thicker than 30 mils the dopant paper might be too far from the silicon substrate, so that the concentration of impurities in the silicon substrate would be lowered.

Balancing all of the above factors, a superior silicon dioxide powder containing layer can be formed by mixing 25 parts by volume of the specific formulation heretofore exemplified with 75 parts by volume of additional isopropanol, thereafter blending 20 cc of the resulting slurry with 45 grams of 140 mesh silicon dioxide powder and applying the same to the silicon substrate to provide a dried thickness of 25 to 30 mils.

Upon air drying, a silicon dioxide particle containing layer results which is white and (under microscopic examination) porous, being cushiony and soft in the sense that a hole can be poked in the layer without shattering the layer, and tiny flakes of the layer will come off if the layer is rubbed. Under microscopic examination, small particles of silicon dioxide can be seen protruding from the surface of this layer.

With either the silicon sphere or silicon dioxide powder containing layer, it is thus seen that the dopant paper is spaced from the silicon substrate by the particles, an organosilicon compound derived film serving as a binder for the network of particles which space the dopant paper from the silicon substrate.

In accordance with either embodiment of the present invention, after the fabrication of the silicon sphere or silicon dioxide powder containing silicon substrate assembly a sheet of dopant paper is placed on the upper surface of the silicon sphere or silicon dioxide powder containing layer.

On a commercial scale, the resulting composite assembly is stacked with a number of like assemblies, inserted into a diffusion furnace and then heated to an elevated temperature sufficient to drive the impurities from the dopant paper into the silicon substrate while these two elements are spaced by the silicon sphere or silicon dioxide powder containing layer.

While stacking is not necessary in theory, dopant papers as are now commercially available are better protected from damage during the high temperatures encountered during diffusion when the composite assembly earlier described is stacked. However, if the dopant paper is sufficiently heavily doped and is sufficiently durable and non-volatile to withstand diffusion furnace temperatures, then stacking of the wafers is not absolutely required.

During the diffusion process the impurities which leave the dopant paper travel an equal distance into the silicon substrate thus producing an extremely sharp junction without rough edges and without wafer surface corrosion as was encountered with prior art solid-solid diffusions of this general nature.

Since the dopant paper is to be uniformly separated from the silicon substrate by the silicon sphere or silicon powder containing layer, sharp bends or folds in the dopant paper should be avoided so that certain of the diffusing impurities do not have to travel a substantially greater distance than other diffusing impurities prior to reaching the silicon substrate.

The sequence of process steps involved in the solid-solid diffusion process of the present invention is schematically illustrated in FIGS. 1a–1e, in this instance for the silicon sphere containing layer embodiment.

Referring initially to FIG. 1a, there is shown in cross-section a cylindrical turntable 10 which is rotatably mounted on a post 12, the cylindrical turntable 10 being provided with an upper surface 13 for receiving a semiconductor substrate 14 to be processed. The semiconductor substrate 14 may be retained on the turntable 10 by any means as is generally used in the art, for example, a suitable vacuum retention means.

As shown in FIG. 1a, the semiconductor substrate 14 is briefly rotated to rapidly distribute thereon the adhering material 16 on the upper exposed surface 13 of the wafer 14, forming a thin, uniform film 18 of the adhering material thereon.

Thereafter, the semiconductor substrate 14 with the thin, uniform layer of the adhering material 18 still in the wet condition is subjected to silicon sphere application, for instance, by sprinkling the silicon spheres 19 onto the still wet layer 18, and dried, providing an assembly as shown in FIG. 1b. This can be done on the cylindrical turntable 10 or after removal of the assembly from the cylindrical turntable.

In the next process step, a dopant sheet material 20 is placed on the upper surface of the silicon spheres 19, the assembly at this stage being shown in FIG. 1c.

The assembly of FIG. 1c is then inserted into a diffusion furnace and heated to an elevated temperature sufficient to drive impurities from the dopant paper 20 through the layer of silicon spheres 19 adhered to the substrate 14 by the adherent film 18 and into the substrate 14, to form a diffused region 21 as shown in FIG. 1d with a junction as represented at 22.

The dopant sheet material 20, silicon spheres 19 and adherent material 18 can then be removed using a suitable etchant, for example, hydrofluoric acid, to provide a semiconductor substrate 14 having a diffused region 21 with a uniform junction 22 therein as shown in FIG. 1e.

It is most preferred in the present invention that the composite assembly of the silicon substrate, silicon spheres or silicon dioxide powder containing layer and dopant paper be "coin stacked". The term "coin stacking" is derived from the nature of the procedure involved since the individual assemblies are handled and stacked in the same fashion as one would stack up a number of identical coins.

One advantage derived from the concept of "coin stacking" is that a single sheet of dopant paper can be used to diffuse separate silicon substrates, i.e., a single sheet of dopant paper can be inserted between two adjacent silicon substrates and in contact with a silicon sphere or silicon dioxide powder containing layer on each silicon substrate, whereupon during the diffusion impurities from the single sheet of dopant paper are diffused into two adjacent silicon substrates. Ignoring the mandatory presence of the silicon sphere or silicon dioxide powder containing layer for purposes of simplicity, essentially a "coin stack" of silicon substrates and dopant papers comprises repeating units of (beginning with a substrate) silicon substrate/dopant paper/silicon substrate.

A further advantage inherent in the "coin stacking" procedure is that alternating dopant papers can contain different types of impurities, whereby individual silicon substrates can be simultaneously diffused on opposing surfaces with different impurities in a single drive-in diffusion heating cycle.

Illustrating several variations on the above concept, for the case where all dopant papers contain an N-type impurity such as phosphorus, one can simultaneously diffuse a plurality of $N^+$ regions into a plurality of N-type silicon substrates. On the other hand, one might wish to simultaneously perform an $N^+$ diffusion and a P diffusion on opposite surfaces of a single silicon substrate, in which case, for example, dopant sheets could alternate along the stack between phosphorus doped N-type dopant paper and boron doped P-type dopant paper. Further, one might wish to dope both opposed surfaces of a silicon substrate of one conductivity type with an impurity opposite in conductivity type to that of the silicon substrate. For example, a pair of opposing PN junctions could be formed by diffusion into the silicon substrate to form either an NPN or a PNP multijunction semiconductor device, such as a transistor.

An advantage inherent in the "coin stacking" procedure is that fewer impurities are lost as a result of the layered structure of the "coin stack" confining the flow of impurities to the adjacent silicon substrate in the layer.

Assuming a "coin stack" arrangement is utilized, the "coin stack" is inserted into a diffusion furnace of any type as is commonly used in the art and thereafter the diffusion is carried out at an elevated temperature for a time sufficient to obtain the desired diffusion depth and/or impurity concentration.

For example, with a silicon substrate being diffused with phosphorus from a dopant paper, temperatures on the order of 1,000° to 1,280° C. are commonly used, with diffusion at 1,250° C. for 110 hours providing a junction depth of about 4 mils with the diffusion of phosphorus into silicon.

The diffusion is preferably carried out under high flow rates of an inert gas, such as nitrogen or argon, in order to purge air from the diffusion system. If desired, a small amount of oxygen, for instance, on the order of 3% by volume, can be introduced into the flowing inert gas stream when only one side of the silicon wafers is being diffused in order to avoid any potential adherence problem between adjacent uncoated silicon substrates.

In those cases where different impurities are being diffused into opposing faces of a silicon substrate, a high flow rate of inert gas is beneficial to avoid cross-doping (where an impurity travels from between two substances into an area which is to be diffused with a different type impurity), i.e., a high flow rate of inert gas serves to carry dopant downstream so that there is no mixing of dopants of differing conductivity types.

Upon the completion of the diffusion step of the present invention, the coin stack assembly is separated, and the dopant paper and the silicon sphere or silicon dioxide powder containing layer removed, for example, using a suitable etchant such as hydrofluoric acid.

Although the above general description has been with reference to the solid-solid diffusion doping of a semiconductor substrate per se, it will be understood by one skilled in the art that the semiconductor can have been previously oxidized and processed using conventional photolithographic oxidizing, masking and etching techniques to form an oxide diffusion mask of any desired type. Typically, an oxide mask is formed over the semiconductor substrate and a window etched therein which will subsequently serve to define the planar PN junction geometry within the semiconductor substrate. Where the semiconductor substrate is silicon, the oxide mask will be a silicon dioxide layer. In this instance, the silicon sphere or silicon dioxide powder comprising layer is formed as an overlayer after all masking, etching, etc., has been completed. The silicon sphere or silicon dioxide containing layer and subsequent diffusion, etc., are performed as earlier described. Generally, a silicon dioxide powder containing layer is more preferred in this embodiment.

Standard photolithographic masking and etching techniques will be needed to remove the oxide coating which forms the masking area after processing. Ohmic contacts can then be applied using standard metallization procedures.

For example, a deep diffused planar PN junction rectifier can be formed in a silicon substrate using a silicon dioxide mask with a central window following the above procedure, with the provision of an appropriate center button contact over the diffused "window" area and an outside annular ring contact over the area masked by the silicon oxide film during the diffusion.

Having thus generally described the invention, the following specific examples illustrate preferred modes of the practice thereof.

EXAMPLE 1

N-type silicon wafers having a resistivity of 45 Ω-cm and a thickness of 12.5 mils were coated on one side with an adhering liquid film having the following composition:

| | | |
|---|---|---|
| 13.4 | cc | tetraethoxysilane |
| 36.0 | cc | ethanol |
| 2.60 | cc | methanol |
| 0.6 | cc | isopropanol |
| 7.60 | cc | glacial acetic acid |

Silicon spheres approximately 16 mils in diameter were applied over the film to form a closely spaced array on the surface of the wafer, i.e., a single layer of silicon spheres, substantially all in perimeter contact, covered the surface.

The adhering film having the silicon spheres adhered thereto was allowed to dry at room temperature so that the silicon spheres were held fast by the film. The film was approximately 1,500° – 2,000 A. thick.

The wafers were then stacked in a quartz diffusion both with the sphere-coated sides facing each other and phosphorus dopant paper placed between the sphere-coated sides. The phosphorus dopant paper is described in U.S. Pat. No. 3,630,793, (Christensen et al.) and in this case comprised 60% phosphorus, based on dopant paper weight. Such paper is available from R. W. Christensen, Filmtronics, Box 1521, Butler, Pa.

The uncoated sides of the wafers were stacked against each other but without dopant paper since only one side was to be diffused.

The quartz diffusion boat was then placed in a diffusion furnace containing a diffusion tube [constant temperature zone 20 inches long by 4 inches in diameter] and the temperature elevated to 1,250° C. while passing a nitrogen stream containing 3 volume percent oxygen therethrough at a rate of 8,000 cc/min. Diffusion was conducted under these conditions for 110 hours. Approximately 300 wafers were processed in this run.

After 110 hours the system was permitted to cool whereafter an $N^+$ junction 0.5 $\Omega$/ $\square$ approximately 4 mils from the silicon wafer surface was determined by analytical techniques.

The dopant paper and silicon sphere comprising layer was removed by etching in hydrofluoric acid.

Since the dopant paper was held away from the surface by the silicon spheres, wafer corrosion (surface attack) was prevented and a highly uniform junction was achieved.

EXAMPLE 2

300 N-type silicon wafers as described in Example 1 were coated on one side with a slurry consisting of 140 mesh silica powder (45 g) and a solution formed from 20 cc of the silane-containing composition described in Example 1 diluted with isopropyl alcohol (25 parts by volume of the silane solution diluted with 75 parts by volume of isopropyl alcohol).

The slurry was applied with a syringe until it flow-coated over the entire surface of the wafer, and allowed to air dry on a flat surface. The solution dried such that it formed a cushiony, soft, porous layer about 1/32 of an inch thick.

The wafers were then coin stacked on a quartz boat with a phosphorus dopant paper between the cushioned sides, all as in Example 1. No phosphorus dopant paper was placed between the sides of the wafers not to be diffused.

The wafers were diffused at 1,250° C. for 60 hours in a flowing stream of an inert gas as in Example 1.

Since the cushion "interface" was porous, the diffusing impurity entered the silicon surface and formed a very uniform junction of 0.5 $\Omega$/ $\square$ 2.7 mils beneath the silicon surface.

Figure 3:
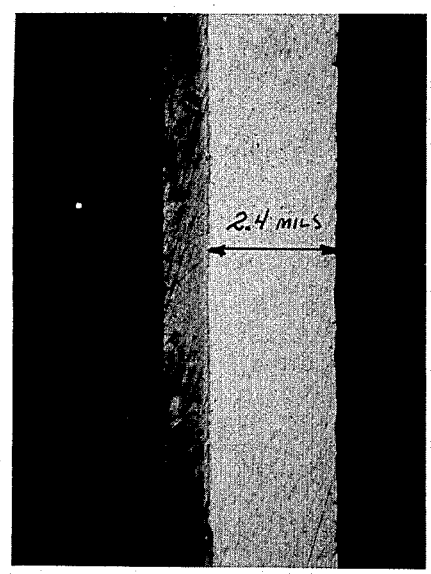

Having thus illustrated the present invention in the above examples, reference should be made to FIGS. 2 and 3 of the attached drawings, which are microphotographs of stained cross-sections of substrates diffused with dopants using the two methods of the present invention, the substrate illustrated in FIG. 2 being produced in accordance with the embodiment where a silicon dioxide powder containing layer is used in combination with a dopant paper and the substrate illustrated in FIG. 3 being produced in accordance with the embodiment where a silicon sphere-containing layer is used in combination with a dopant paper.

The diffusion front in FIG. 2 was driven 3.94 mils into the semiconductor substrate, and a substantially straight diffusion front can easily be seen.

In FIG. 3, the diffusion front is again extremely straight, though the diffusion front in this instance was only driven 2.4 mils into the silicon substrate.

Figure 4:
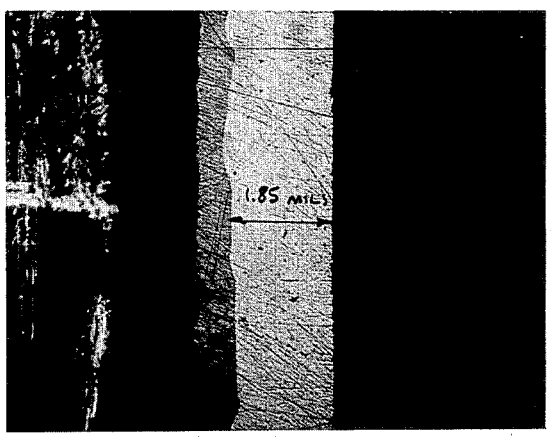
FIG. 4 is a photomicrograph of a stained cross-section of a substrate diffused with a dopant where the present invention is not used.

Referring finally to FIG. 4, a silicon sphere or silicon dioxide powder containing layer of the present invention was not used, rather, only the silica film layer was used (no spheres or powder). The irregular diffusion front resulting is easily seen. The procedure of now-abandoned U.S. Patent Application Ser. No. 265,028, filed June 21, 1972 by Paul M. Garavaglia et al. and entitled "Process for Fabricating Deep Diffused Semiconductor Devices" was followed.

While the invention has been particularly shown and described with reference to preferred embodiments thereof, it will be understood by those skilled in the art that various changes in form and details may be made therein without departing from the spirit and scope of the invention.

What is claimed is:

1. In a high temperature process for diffusing impurities from a solid diffusion source material, said material being constituted by a sheet containing a dopant, into a solid semiconductor body, the improvement which comprises the diffusion source material and semiconductor body being spaced by a layer comprising particles of an undoped, noncontaminating, particulate material inert to the diffusion conditions, whereby uniform diffusion is achieved.

2. The process of claim 1, where the semiconductor body is silicon.

3. The process of claim 2, where the material inert to the diffusion conditions comprises particles of silicon or silicon dioxide.

4. The process of claim 3, where the particles of silicon or silicon dioxide are adhered to the silicon substrate.

5. The process of claim 4, where the particles of silicon are adhered to the silicon substrate via a layer of an organosilicon compound.

6. The process of claim 5, where the particles of silicon have an average particle diameter of from about 10 mils to about 20 mils.

7. The process of claim 6, where the organosilicon compound is an organosilane.

8. The process of claim 7, where the organosilane is a tetraalkoxysilane.

9. The process of claim 7, where the organosilane has the formula

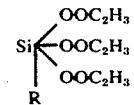

where R is an acetate or vinyl group.

10. The process of claim 8, where the tetraalkoxysilane is tetraethoxysilane and the layer thereof is from about 1,500 A. to about 2,000 A. thick.

11. The process of claim 4, where the silicon dioxide particles are adhered to the silicon substrate via an organosilicon compound to provide a soft, cushiony, porous layer, said layer lifting from the silicon substrate during the diffusion.

12. The process of claim 11, where the organosilicon compound is an organosilane.

13. The process of claim 12, where the organosilicon is tetraalkoxysilane.

14. The process of claim 11, where the organosilicon has the formula

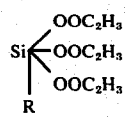

where R is an acetate or vinyl group.

15. The process of claim 13, where the tetraalkoxysilane is tetraethoxysilane and the layer is about 25 to about 30 mils thick.

16. The process of claim 15, where said particles of silicon dioxide have a size of about 140 mesh to 160 mesh.

17. The process of claim 1, where said dopant source material is a prefabricated sheet formed of an organic binder and a solvent therein containing selected impurities of a concentration suficient in magnitude to cause said dopant material to function as a substantially infinite source of impurities.

* * * * *